United States Patent
Meiser et al.

(10) Patent No.: US 9,419,130 B2
(45) Date of Patent: Aug. 16, 2016

(54) SEMICONDUCTOR DEVICE AND INTEGRATED CIRCUIT

(71) Applicant: Infineon Technologies Austria AG, Villach (AT)

(72) Inventors: Andreas Meiser, Sauerlach (DE); Franz Hirler, Isen (DE); Peter Irsigler, Obernberg am Inn (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/092,223

(22) Filed: Nov. 27, 2013

(65) Prior Publication Data

US 2015/0145030 A1    May 28, 2015

(51) Int. Cl.
*H01L 27/088* (2006.01)
*H01L 29/78* (2006.01)
*H01L 29/40* (2006.01)
*H01L 29/423* (2006.01)
*H01L 29/06* (2006.01)

(52) U.S. Cl.
CPC ........ *H01L 29/7825* (2013.01); *H01L 29/4236* (2013.01); *H01L 29/78* (2013.01); *H01L 29/7802* (2013.01); *H01L 29/7824* (2013.01); *H01L 29/7828* (2013.01); *H01L 29/7831* (2013.01); *H01L 29/7838* (2013.01); *H01L 29/0692* (2013.01); *H01L 29/0696* (2013.01); *H01L 29/407* (2013.01); *H01L 29/42356* (2013.01)

(58) Field of Classification Search
CPC .............. H01L 29/739; H01L 29/7825; H01L 29/1095; H01L 27/88
USPC .......... 257/133, 139, 349, E29.262; 438/270, 438/287
See application file for complete search history.

(56) References Cited

U.S. PATENT DOCUMENTS

| | | | | |
|---|---|---|---|---|
| 4,393,391 A * | 7/1983 | Blanchard | ...................... | 257/343 |
| 5,349,212 A * | 9/1994 | Seki | .............................. | 257/133 |
| 5,548,150 A * | 8/1996 | Omura et al. | ................. | 257/349 |
| 7,538,000 B2 * | 5/2009 | Dao | .............................. | 438/287 |
| 2002/0155685 A1 | 10/2002 | Sakakibara | | |
| 2012/0068222 A1 * | 3/2012 | Kitagawa | ...................... | 257/139 |

OTHER PUBLICATIONS

Mehta, V.R., et al., "Flat-band Voltage Study of Atomic-layer-Deposited Aluminum-oxide Subjected to Spike Thermal Annealing." MRS Proceedings, 2003 MRS Spring Meeting, 2003, pp. 1-5, vol. 765, Materials Research Society.

(Continued)

*Primary Examiner* — Cuong Q Nguyen
*Assistant Examiner* — Tong-Ho Kim
(74) *Attorney, Agent, or Firm* — Murphy, Bilak & Homiller, PLLC (57) ABSTRACT

A semiconductor device in a semiconductor substrate includes a first drain region and a second drain region, a first drift zone and a second drift zone, at least two gate electrodes in the semiconductor substrate, and a channel region between the gate electrodes. The first drift zone is arranged between the channel region and the first drain region, and the second drift zone is arranged between the channel region and the second drain region. The second drain region is disposed on a side of the gate electrode, the side of the gate electrode being remote from the side of the first drain region.

22 Claims, 5 Drawing Sheets

(56) References Cited

OTHER PUBLICATIONS

Meiser, A., et al., "Semiconductor Device and Method of Manufacturing a Semiconductor Device." U.S. Appl. No. 13/692,059, filed Dec. 3, 2012.

Mirchandani, A., et al., "A Novel N-Channel MOSFET Featuring an Integrated Schottky and No Internal P-N Junction." Proceedings of the 16th International Symposium on Power Semiconductor Devices and ICs, May 24-27, 2004, pp. 405-408, Kitakyushu, Japan.

* cited by examiner

SEMICONDUCTOR DEVICE AND INTEGRATED CIRCUIT

BACKGROUND

Power transistors commonly employed in automotive and industrial electronics require a low on-state resistance ($R_{on}$), while securing a high voltage blocking capability. For example, a MOS ("metal oxide semiconductor") power transistor should be capable, depending upon application requirements to block drain to source voltages $V_{ds}$ of some tens to some hundreds or thousands of volts. MOS power transistors typically conduct very large currents which may be up to some hundreds of Amperes at typical gate-source voltages of about 2 to 20 V.

Power transistors usually include a body contact region that electrically contacts the body region to the source terminal. Thereby, a parasitic bipolar transistor is widely suppressed or deteriorated. Due to the body contact region, a pn diode is formed that results in a transistor having reverse blocking capabilities in one direction only.

Attempts are being made to provide semiconductor devices having further improved characteristics.

SUMMARY

According to an embodiment, a semiconductor device in a semiconductor substrate comprises a first drain region and a second drain region, a first drift zone and a second drift zone, at least two gate electrodes in the semiconductor substrate, and a channel region between the gate electrodes. The first drift zone is arranged between the channel region and the first drain region, the second drift zone is arranged between the channel region and the second drain region, and the second drain region being disposed on a side of the gate electrode, the side of the gate electrode being remote from the side of the first drain region.

According to a further embodiment, a semiconductor device in a semiconductor substrate comprises a first drain region and a second drain region, a first drift zone, at least a first gate electrode and a second gate electrode arranged in the semiconductor substrate, a channel region disposed between the first and the second gate electrodes, and a first gate dielectric between the first gate electrode and the channel region and a second gate dielectric between the second gate electrode and the channel region. The first drift zone is arranged between the channel region and the first drain region, wherein the first gate electrode is electrically connected to a first gate terminal and the second gate electrode is electrically connected to a second gate terminal disconnected from the first gate terminal or wherein the second gate dielectric is different from the first gate dielectric.

According to a further embodiment, a semiconductor device comprises a transistor in a semiconductor substrate having a first main surface. The transistor comprises a source region of a first conductivity type, a drain region of the first conductivity type, a channel region of the first conductivity type, a drift zone between the channel region and the drain region, and a gate electrode at the channel region, the gate electrode being arranged in gate trenches formed in the first main surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments and are incorporated in and constitute a part of this specification. The drawings illustrate the main embodiments and together with the description serve to explain the principles. Other embodiments and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an re-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

Figure 1A:
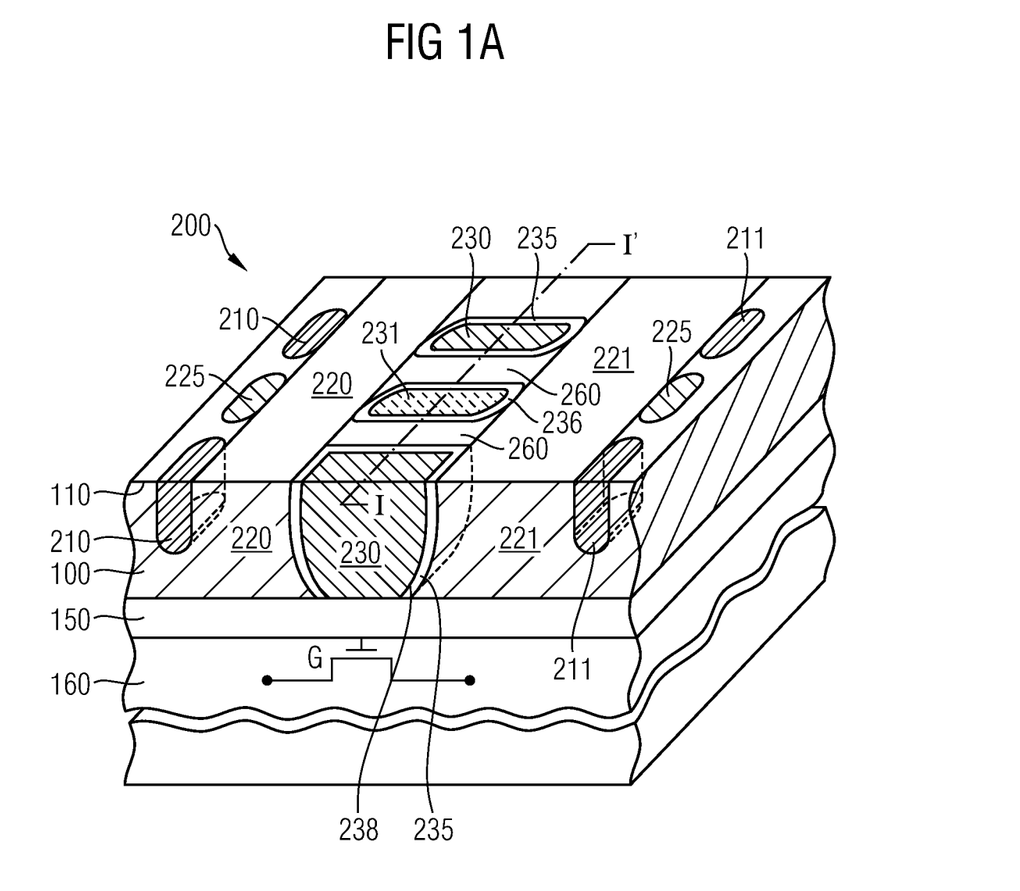
FIG. 1A shows a perspective view of a semiconductor device according to an embodiment.

FIG. 1A shows a perspective view of a semiconductor device 200 according to an embodiment. The semiconductor device 200 comprises a first drain region 210 and a second drain region 211, a first drift zone 220 and a second drift zone 221 and at least two gate electrodes 230, 231 arranged in the semiconductor substrate. The semiconductor device further comprises a channel region 260 disposed between the gate electrodes 230, 231. The semiconductor device may further comprise a first gate dielectric layer 235 that insulates the first gate electrode 230 from the adjacent substrate material. Likewise, the semiconductor device 200 may comprise a second gate dielectric layer 236 that insulates the second gate electrode 231 from the adjacent substrate material.

The first drift zone 220 is arranged between the channel region 260 and the first drain region 210, and the second drift zone 221 is arranged between the channel region 260 and the second drain region 211. The second drain region 211 is disposed on a side of the gate electrode 230, the side being remote from the side of the first drain region 210. Accordingly, the first drain region 210, the first drift zone 220, the channel region 260, the second drift zone 221 and the second drain region 211 are arranged in this order along a first direction which may be parallel to the first main surface 110 of the semiconductor substrate 100. According to this embodiment, the semiconductor device implements a power transistor including two drift zones. As will be explained in the following, as a result, the blocking characteristics of the power transistor may be improved when the transistor is operated in different polarities.

The first and the second drain region may be of a first conductivity type, for example, n-type. Further, the channel region 260 may be of the first conductivity type, having a lower doping concentration than the drain regions. Moreover, the drift regions may as well be of the first conductivity type, at a doping concentration which may be between the doping concentration of the channel region and the drain regions. According to a further implementation, the doping concentration of the drift region may be lower than doping concentration of the channel region and the drain region. The transistor implements a transistor having a channel region of the first conductivity type which does not include a body region of the second conductivity type. Accordingly, this transistor implements a depletion transistor or a normally-on transistor. Such a normally on-transistor usually is in a conducting state when no gate voltage or a gate voltage corresponding to 0 V is applied.

As is shown in FIG. 1, the gate electrodes include a first gate electrode 230 and a second gate electrode 231. According to an embodiment, the first gate electrode 230 is held at a potential different from the potential of the second gate electrode 231. For example, this may be accomplished by electrically connecting the first gate electrode to a first gate terminal different from a second gate terminal electrically connected to the second gate electrode. According to a further embodiment, this may be accomplished by providing the second gate dielectric adjacent to the second gate electrode with negative charges that shift the threshold voltage of the gate electrode.

For example, this may be accomplished by forming an initial dielectric layer that may comprise silicon oxide, silicon nitride or a combination of these materials. Thereafter, an aluminum oxide layer may be formed, the aluminum oxide layer having a thickness of e.g. less than 1 nm. Then, an annealing process is performed in an oxidizing atmosphere to form a dielectric layer having a large amount of fixed charge that is due to the incorporation of $Al_2O_3$. This may result in a significant shift of the threshold voltage of the transistor. For example, the concentration of the negative charges may be $10^{11}$ to $10^{13}$ $cm^{-2}$. According to a further method, an oxide layer may be deposited on the aluminum oxide layer followed by an annealing process.

By shifting the threshold voltage or applying a different voltage to the second gate electrode, the current voltage characteristics of the power transistor may be shifted so that at a gate voltage corresponding to 0 V, the transistor is in a non-conducting state.

For example, the material of the first and the second gate electrode may be doped polysilicon, for example, n doped polysilicon. By way of example, the polysilicon may be doped with phosphorous. In another embodiment the first and the second gate electrodes may be p doped polysilicon, e.g. boron doped polysilicon. The work function of p-doped polysilicon may be beneficial for increasing the threshold voltage for an n-channel transistor.

The respective components are formed in a portion of a semiconductor substrate 100. For example, the semiconductor substrate 100 may be an SOI ("silicon-on-insulator") substrate including a buried oxide layer 150 and a semiconductor base layer 160. The first and second gate electrodes 230, 231 may be formed so as to extend to the buried oxide layer 150. Accordingly, no conductive portion is present between the gate electrode and the buried oxide layer 150 and the gate electrodes accomplish a lateral isolation. The drift zones 220, 221 may be formed so as to have the same blocking voltage characteristics. For example, the first and second drift zones 220, 221 may have the same doping concentrations and the same lengths measured along the direction between drain region and gate electrode. According to a further embodiment, the first and second drift zones 220, 221 may be formed so as to have different blocking voltage characteristics. For example, they may have different doping concentrations at a certain distance measured from the gate electrode. According to an embodiment, the first and second drift zones 220, 221 may have a different length. According to the embodiment shown in FIG. 1A, the gate electrodes 230, 231 are disposed in gate trenches 238 that are formed in the first main surface 110 of the semiconductor substrate 100. The first and second drain regions 210, 211 may be disposed adjacent to the first main surface 110. According to a further embodiment, the first and second drain regions 210, 211 may be arranged on opposing surfaces of the semiconductor substrate 100. In this case, the gate electrodes 230, 231 may be formed as buried gate electrodes. According to this embodiment, the further components of the power transistor may be manufactured by epitaxially growing a further semiconductor layer and forming the respective components in the epitaxially grown semiconductor layer. The semiconductor device shown in FIG. 1A further comprises contact regions 225, i.e. portions of the second conductivity type. The contact regions 225 are disposed at the side of the first and second drain regions and are electrically connected to the first or second drain terminal, respectively. The contact regions 225 extract minority carriers from the drift zones 220, 221. For example, in case of a drift zone having n-type conductivity, holes are extracted by the contact regions 225. Alternatively, the contact regions 225 may also comprise Schottky contacts in contact with regions of the first conductivity type, the regions of the first conductivity type having a doping concentration lower compared to the drain regions. The contact regions 225 may also comprise Schottky contacts in contact with the drift zones 220, 221.

Field plates may be disposed at the first and/or second drift zone 220, 221 or embedded in the first and/or second drift zone. For example, the field plates may be formed in field plate trenches, the field plate trenches being disposed in the first main surface 110 of the semiconductor substrate 100. As is common, the field plates may be insulated from the first and/or second drift zone by means of a field plate dielectric layer.

When a suitable voltage is applied to the gate electrode 230, an inversion layer is formed at the boundary between the channel regions 260 and the insulating gate dielectric material 235. Accordingly, the transistor is in a conducting state from the first drain region 210 to the second drain region 211 or vice-versa. The polarity of the "suitable voltage" may, for example, depend on the polarity of the dopants of the channel region. The conductivity of the channel that is formed in the channel region 260 is controlled by the gate electrode. The second gate electrode 231 controls the threshold voltage of the transistor. To be more precise, the first gate electrode controls the conductivity of the channel, and the threshold voltage is set by applying a different, typically time independent voltage to the second gate electrode 231 or by setting the same gate voltage to the second gate electrode, wherein the second gate dielectric 236 is modified in comparison with the first gate dielectric layer 235. By controlling the conductivity of the channel formed in the channel region, the current flow from the first drain region 210 to the second drain region 211 via the channel formed in the channel region 260 may be controlled.

When the transistor is switched off, no conductive channel is formed at the boundary between the channel region 260 and the first gate dielectric material 235, so that only a subthreshold current flows. Due to the presence of the first and/or second drift zones 220, 221, the blocking or breakdown voltage characteristics may be further improved.

As is indicated in the perspective view shown in FIG. 1A, the channel region 260 has the shape of a ridge. This is further illustrated in the cross-sectional view shown in FIG. 1B, which is taken between I and I'. The cross-sectional view is taken so as to intersect a plurality of first and second gate electrodes 230, 231 and channel regions 260. The ridge may have a topside 260c, and side walls 260b.

Figure 1B:
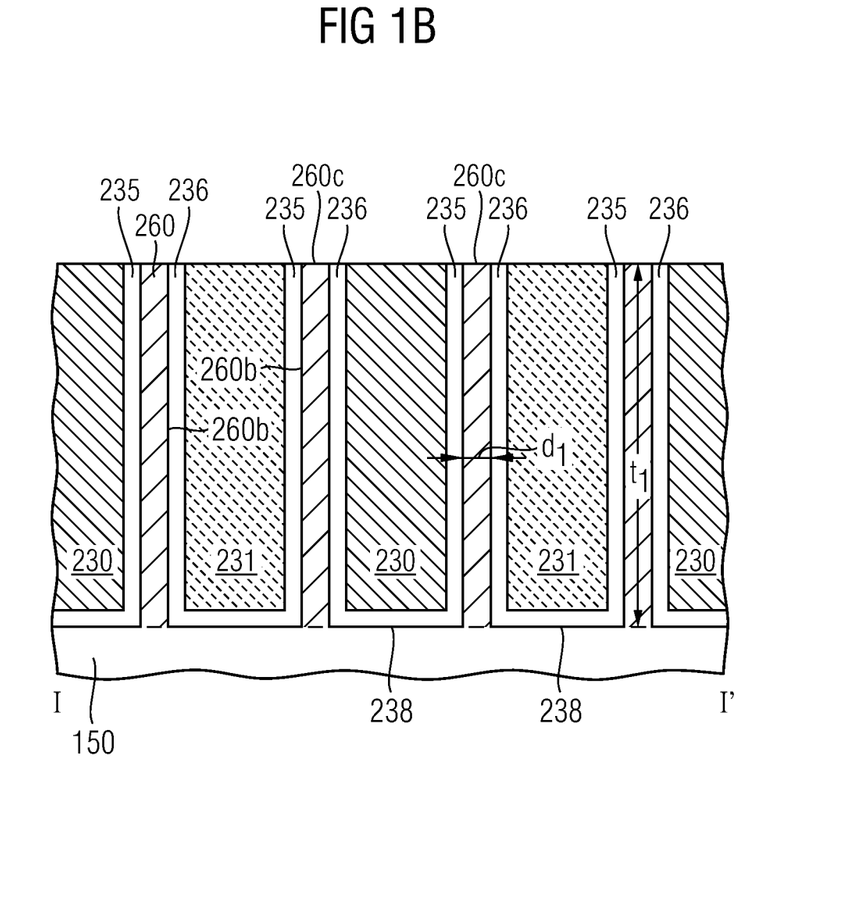
FIG. 1B shows a cross-sectional view of the semiconductor device shown in FIG. 1A.

According to an embodiment, the width d1 of the channel region 260 fulfills the following relationship: $d1 \leq l_d$, wherein $l_d$ denotes a length of a depletion zone which is formed at the interface between the gate dielectric layer 235 and the channel region 260. For example, the width of the depletion zone may be determined as:

$$l_d = \sqrt{\frac{4\varepsilon_s kT \ln(N_A/n_i)}{q^2 N_A}} \quad (1)$$

wherein $\varepsilon_s$ denotes the permittivity of the semiconductor material ($11.9 \times \varepsilon_0$ for silicon, $\varepsilon_0 = 8.85 \times 10^{-14}$ F/cm), k denotes the Boltzmann constant ($1.38066 \times 10^{-23}$ J/K), T denotes the temperature, ln the denotes the natural logarithm, $N_A$ denotes the impurity concentration of the semiconductor body, $n_i$ denotes the intrinsic carrier concentration ($1.45 \times 10^{10}$ cm$^{-3}$ for silicon at 27° C.), and q denotes the elementary charge ($1.6 \times 10^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 10 to 200 nm, for example, 20 to 60 nm along the first main surface 110 of the semiconductor substrate 100.

According to the embodiment in which the width $d1 \leq l_d$, the transistor 200 is a so-called "fully-depleted" transistor in which the channel region 260 is fully depleted when the first gate electrode 230 is set to an on-voltage. In such a transistor, an optimal sub-threshold voltage may be achieved and short channel effects may be efficiently suppressed, resulting in improved device characteristics.

Figure 2:
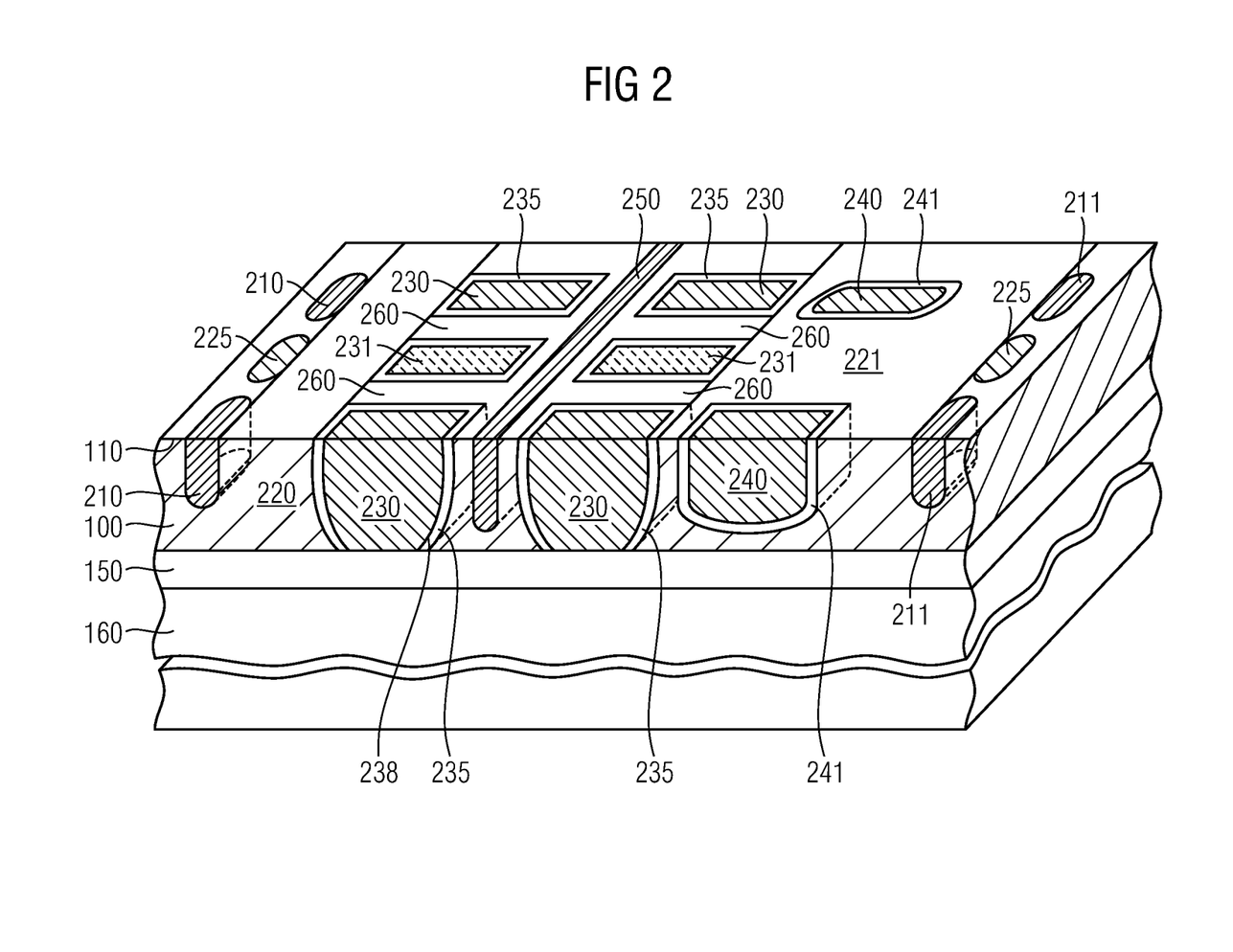
FIG. 2 shows a modification of the embodiment shown in FIG. 1.

FIG. 2 shows a perspective view of a semiconductor device according to a further embodiment. The semiconductor device shown in FIG. 2 basically corresponds to the semiconductor device illustrated in FIG. 1. In addition, FIG. 2 shows field plates 240 that are arranged in field plate trenches formed in the first main surface 110 of the semiconductor substrate. The field plates 240 are insulated from the adjacent semiconductor material by means of a field plate dielectric layer 241.

Further, the semiconductor device comprises a source region 250 that is disposed between adjacent gate trenches 238. The source region 250 may be of the first conductivity type, for example n-type. The source region 250 provides a reference for applying the gate voltage. The source region 250 may be connected to a source terminal and may be used for charging and discharging the channel region when charging and discharging the gate electrodes 230, 231. The source region 250 may be interrupted. Further, the source region 250 may extend to a smaller depth than is indicated in FIG. 2. The first drain region 210, the first drift zone 220, one of the gate electrodes 230, 231, the source region 250, another corresponding one of the gate electrodes 230, 231, the second drift zone 221, and the second drain region 211 may be arranged along the first direction. In the arrangement of FIG. 2, the current flows from the first drain regions 210 to the second drain regions 211 and vice versa.

Figure 3A:
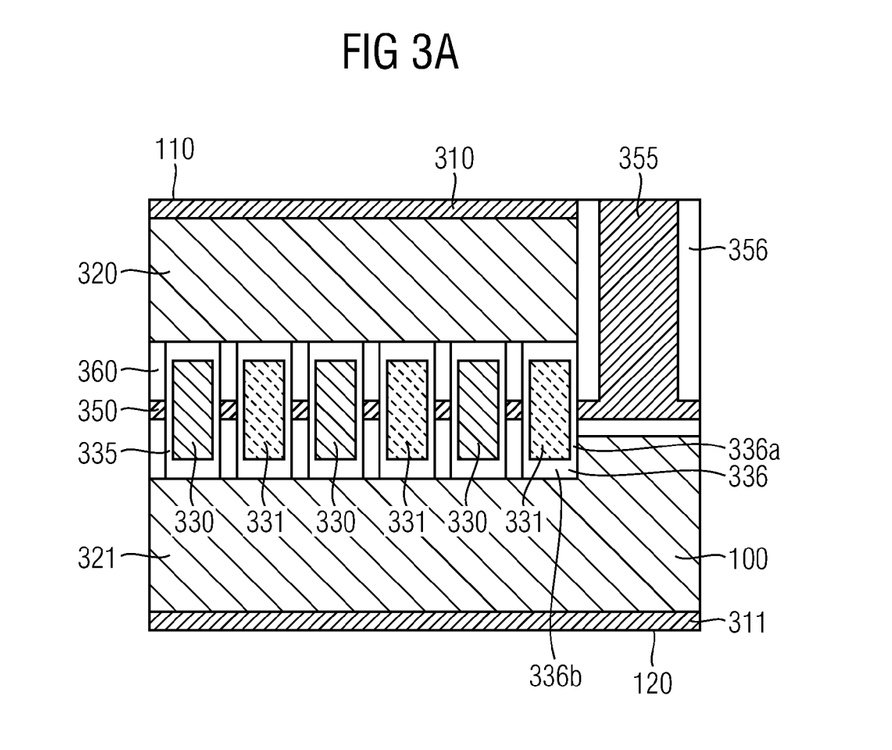
FIG. 3A shows a cross-sectional view of a semiconductor device according to a further embodiment.

FIG. 3A shows a cross-sectional view of a semiconductor device of still a further embodiment. According to the embodiment of FIG. 3A, the first drain region 310 is disposed adjacent to the first main surface 110 of the semiconductor substrate 100. Further, the second drain region 311 is disposed adjacent to a second main surface 120 of the semiconductor substrate 100. The first and the second gate electrodes 330, 331 are implemented as buried gate electrodes and a further semiconductor material is epitaxially grown over the gate electrodes 330, 331. The first drift zone 320 and the first drain region 310 may be formed in this overgrown semiconductor material. In a similar manner as has been discussed above with reference to FIG. 1A, the first and second drain regions 310, 311 are of the first conductivity type, for example, with n-type. The drift zones 320, 321 are of the first conductivity type, having a lower impurity concentration than the drain regions. The first and second drift zones 320, 321 may be doped at the same or at different doping levels at a given distance measured from one of the gate electrodes 330, 331. Further, the length of the first and second drift zones 320, 321 may be equal to each other or different. The gate electrodes include first gate electrodes 330 and second gate electrodes 331 which may be implemented in the manner as has been discussed above. Further, a channel region 360 is disposed between adjacent gate electrodes. The channel region 360 may be doped with dopants of a first or a second conductivity type. The semiconductor device further may comprise a source region 350 for providing a reference of a voltage applied to the gate electrode. The source electrode 350 may be electrically connected via a source contact 355 to a source terminal. The source contact 355 is insulated from adjacent semiconductor material by means of a dielectric material 356. The gate dielectric layer 335 may comprise silicon oxide, silicon nitride, or any other suitable dielectric material. Likewise, the second gate dielectric layer 336 may comprise any of these materials. Optionally, the second gate dielectric layer 336 may be doped so as to shift the threshold voltage as has been discussed above. For example the gate dielectric layer that is adjacent to the channel region may be thinner than the gate dielectric material that is disposed between the gate electrode and the adjacent drift zone 320, 321. For example, as is indicated in FIG. 3A, the portion 336a of the gate dielectric layer may be thinner than the portion 336b of the gate dielectric material. Thereby, the gate-drain capacitance may be decreased, resulting in reduced switching losses.

Figure 3B:
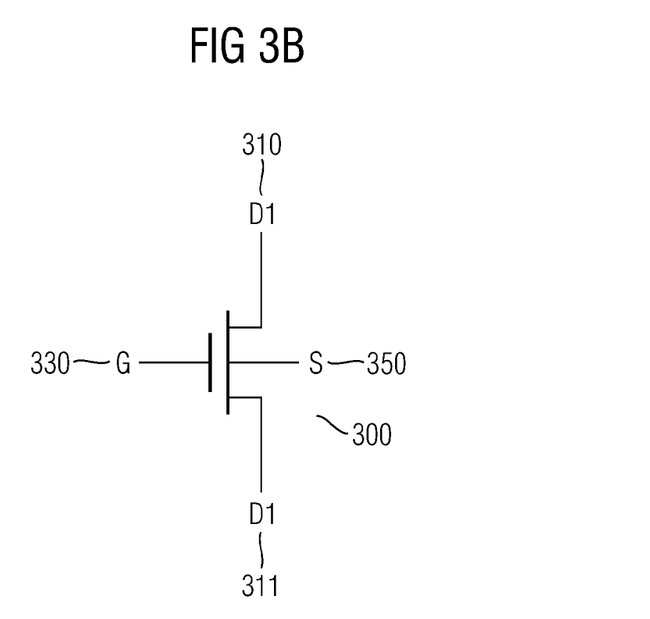
FIG. 3B shows an equivalent circuit diagram of the semiconductor device shown in FIG. 3A.

FIG. 3B illustrates an equivalent circuit diagram of the semiconductor device illustrated in FIG. 3A. As is illustrated, a current flow is accomplished between the first and the second drain regions 310, 311. Further, the gate voltage is applied to the gate electrode 330 with reference to the potential of the source electrode 350. According to the embodiment of FIGS. 3A and 3B, the source electrode 350 is optional.

Figure 4:
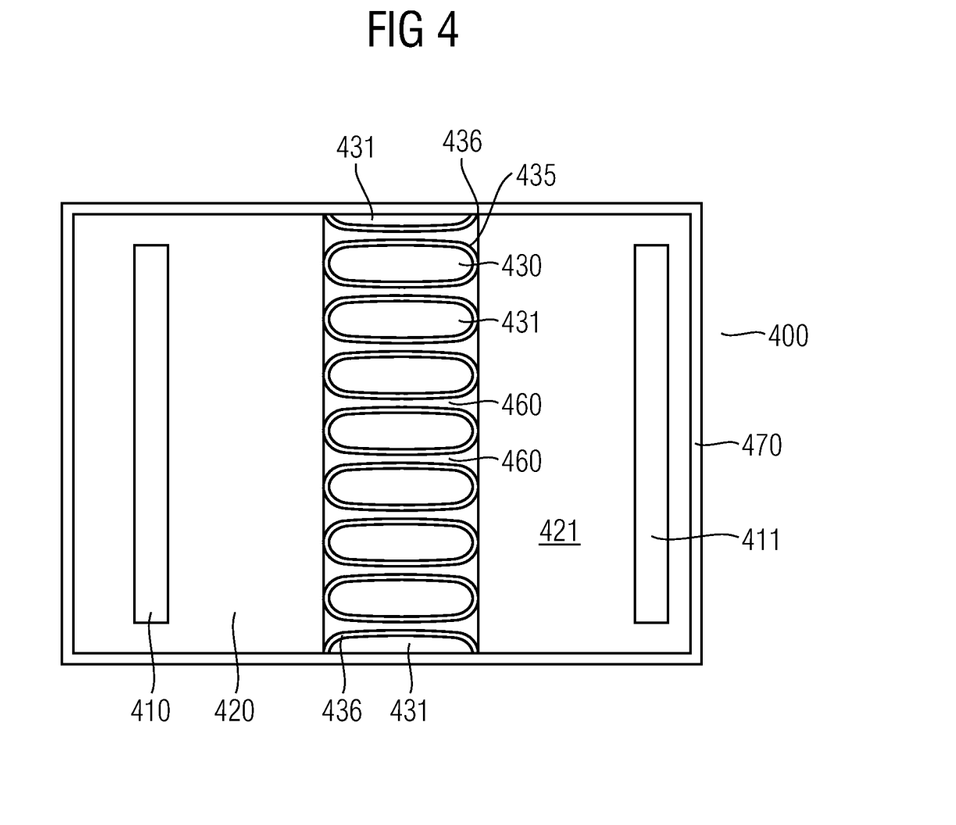
FIG. 4 shows a cross-sectional view of a semiconductor device according to a further embodiment, taken in a plane parallel to the first main surface of the semiconductor substrate.

FIG. 4 shows a plan view or, differently stated, a cross-sectional view of a semiconductor device 400 according to a further embodiment. In FIG. 4, the same components are designated by references which are incremented by 100 with respect to FIG. 3A, or incremented by 200 with respect to FIG. 2. The semiconductor device illustrated in FIG. 4 includes a first and a second drain region 410, 411. Further, the semiconductor device includes first gate electrodes 430 and second gate electrodes 431. A channel region 460 is disposed between adjacent gate electrodes 430, 431. A first drift zone 420 and a second drift zone 421 are disposed on either sides of the gate electrodes 430 between the gate electrode and the first or second drain region, respectively. The semiconductor device 400 further comprises a termination region 470 inclosing the transistor cell array. The second gate electrodes 431 are disposed adjacent to the termination region 470. Thereby, an appropriate setting of the threshold voltage is ensured in all of the transistor cells illustrated in FIG. 4.

As has been described above, the semiconductor device according to the embodiments may eliminate a pn junction so as to eliminate the reverse recovery losses for fast switching applications. Further, due to the presence of the drift zones on either side of the gate electrode, the blocking voltage characteristics of the device is further improved. In particular, the blocking characteristic of the device may be exhibited in each direction, for example, without dependence from a polarity of the applied voltage. Accordingly, the semiconductor device may implement a bidirectional switch.

According to an embodiment, a bidirectional switch in a semiconductor substrate may comprise a first drain region and a second drain region, a first drift zone and a second drift zone, and at least two gate electrodes arranged in the semiconductor substrate. The bidirectional switch may further comprise a channel region between the gate electrodes. The first drift zone may be arranged between the channel region and the first drain region, the second drift zone may be arranged between the channel region and the second drain region. The second drain region may be disposed on a side of the gate electrode, the side being remote from the side of the first drain region.

According to a further embodiment, a bidirectional switch in a semiconductor substrate may comprise a first drain region and a second drain region, a first drift zone, and at least a first gate electrode and a second gate electrode arranged in the semiconductor substrate. The bidirectional switch further comprises a channel region disposed between the first and the second gate electrodes, a first gate dielectric between the first gate electrode and the channel region and a second gate dielectric between the second gate electrode and the channel region. The first drift zone is arranged between the channel region and the first drain region. The first gate electrode may be electrically connected to a first gate terminal, and the second gate electrode may be electrically connected to a second gate terminal disconnected from the first gate terminal. Alternatively, the second gate dielectric may be different from the first gate dielectric.

According to a further embodiment, a bidirectional switch comprises a transistor in a semiconductor substrate having a first main surface. The transistor comprises a source region of a first conductivity type, a drain region of the first conductivity type, a channel region of the first conductivity type, a drift zone between the channel region and the drain region, and a gate electrode at the channel region. The gate electrode is arranged in gate trenches formed in the first main surface.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device in a semiconductor substrate, comprising:
   a first drain region and a second drain region;
   a first drift zone and a second drift zone;
   at least two gate electrodes in the semiconductor substrate; and
   a channel region between the at least two gate electrodes;
   wherein the first drift zone is arranged in contact with the channel region between the channel region and the first drain region, the second drift zone is arranged in contact with the channel region between the channel region and the second drain region, the second drain region is disposed on a side of the at least two gate electrodes, and the side of the at least two gate electrodes is remote from the side of the first drain region.

2. The semiconductor device according to claim 1, further comprising a source region disposed at the channel region.

3. The semiconductor device according to claim 1, wherein the at least two gate electrodes comprise a first gate electrode and a second gate electrode, wherein the first gate electrode is electrically connected to a first gate terminal and the second gate electrode is electrically connected to a second gate terminal disconnected from the first gate terminal.

4. The semiconductor device according to claim 1, further comprising a first gate dielectric between the first gate electrode and the channel region, and a second gate dielectric between the second gate electrode and the channel region, the second gate dielectric being different from the first gate dielectric.

5. The semiconductor device according to claim 1, wherein the first drain region and the second drain region and the first drift zone and the second drift zone have a first conductivity type.

6. The semiconductor device according to claim 5, wherein the channel region has a second conductivity type.

7. The semiconductor device according to claim 5, wherein the channel region has the first conductivity type.

8. The semiconductor device according to claim 1, wherein the first drift zone has a length different from a length of the second drift zone, the length being measured in a direction parallel to the direction between the first and the second drain regions.

9. The semiconductor device according to claim 1, wherein the first drift zone is doped with dopants having a doping concentration different from a doping concentration of dopants of the second drift zone, the doping concentration being measured at the same distance from one of the gate electrodes.

10. The semiconductor device according to claim 1, wherein the first and the second drain regions are disposed adjacent to a first main surface of the semiconductor substrate and the gate electrodes are arranged in gate trenches formed in the first main surface.

11. The semiconductor device according to claim 1, wherein the first drain region is disposed adjacent to a first main surface of the semiconductor substrate and the second drain region is disposed adjacent to a second main surface of the semiconductor substrate opposite to the first main surface.

12. An integrated circuit comprising the semiconductor device according to claim 1.

13. A semiconductor device in a semiconductor substrate, comprising:
   a first drain region and a second drain region;
   a first drift zone;
   at least a first gate electrode and a second gate electrode arranged in the semiconductor substrate;
   a channel region defined by the first gate electrode and the second gate electrode; and
   a first gate dielectric between the first gate electrode and the channel region and a second gate dielectric between the second gate electrode and the channel region,
   wherein the first drift zone is arranged between the channel region and the first drain region,
   wherein the first gate electrode is electrically connected to a first gate terminal and the second gate electrode is electrically connected to a second gate terminal disconnected from the first gate terminal, or the second gate dielectric is different from the first gate dielectric,
   wherein the first gate electrode is configured to control a current between the first drain region and the second drain region.

14. The semiconductor device according to claim 13, wherein the second gate dielectric includes charges to shift a threshold voltage and the first gate electrode and the second gate electrode are electrically connected to a gate terminal.

15. The semiconductor device according to claim 13, further comprising a second drift zone arranged between the channel region and the second drain region.

16. The semiconductor device according to claim 13, wherein the first drain region and the second drain region are disposed at a first main surface of the semiconductor substrate, and wherein the first gate electrode and the second gate electrode are arranged in gate trenches formed in the first main surface.

17. The semiconductor device according to claim 13, wherein one of the first drain region and the second drain region is disposed adjacent to a first main surface of the semiconductor substrate and the other one of the first drain region and the second drain region is disposed adjacent to a second main surface of the semiconductor substrate opposite from the first main surface.

18. An integrated circuit comprising the semiconductor device according to claim 13.

19. A semiconductor device comprising a transistor in a semiconductor substrate having a first main surface, the transistor comprising:
   a source region of a first conductivity type;
   a drain region of the first conductivity type;
   a channel region of the first conductivity type;
   a drift zone between the channel region and the drain region; and
   a first gate electrode and a second gate electrode in respective gate trenches formed in the first main surface, the gate trenches patterning the channel region into the shape of a ridge.

20. The semiconductor device according to claim 19, wherein the source region is disposed at the first main surface and the drain region is disposed at a second main surface of the semiconductor substrate opposite to the first main surface.

21. The semiconductor device according to claim 19, wherein the source region and the drain region are disposed at the first main surface.

22. An integrated circuit comprising the semiconductor device according to claim 19.

* * * * *